United States Patent [19]

Kimura et al.

[11] Patent Number: 5,286,926
[45] Date of Patent: Feb. 15, 1994

[54] INTEGRATED CIRCUIT PACKAGE AND PROCESS FOR PRODUCING SAME

[75] Inventors: Yukihiro Kimura; Nobuhiko Miyawaki; Masao Kuroda, all of Aichi, Japan

[73] Assignee: NGK Spark Plug Co., Ltd., Aichi, Japan

[21] Appl. No.: 868,568

[22] Filed: Apr. 15, 1992

[30] Foreign Application Priority Data

Apr. 16, 1991 [JP] Japan .................................. 3-83942

[51] Int. Cl.⁵ ............................................. H05K 1/00
[52] U.S. Cl. .................................. 174/250; 174/260; 174/262; 427/97; 439/82
[58] Field of Search ............... 174/260, 262, 263, 264, 174/250, 255; 361/412, 414; 29/852, 845; 427/96, 97; 156/630; 439/78, 55, 82

[56] References Cited

U.S. PATENT DOCUMENTS

| | | | |
|---|---|---|---|
| 3,872,236 | 3/1975 | Swengel, Sr. et al. | 174/261 |
| 3,934,334 | 1/1976 | Hanni | 174/262 |
| 3,934,335 | 1/1976 | Nelson | 174/262 |
| 4,211,603 | 7/1980 | Reed | 174/262 |
| 4,230,385 | 10/1980 | Ammon et al. | 174/264 X |
| 4,720,268 | 1/1988 | Weiss | 439/82 |
| 4,873,122 | 10/1989 | Darken | 427/97 |
| 4,933,045 | 6/1990 | DiStefano et al. | 156/630 |
| 5,019,946 | 5/1991 | Eichelberger et al. | 361/414 |

OTHER PUBLICATIONS

N. Goldberg, "Design of Thin Film Multichip Modules," The International Journal For Hybrid Microelectronics, vol. 4, Oct. 1981, pp. 289–293.
Y. Noguchi et al, "Analysis of Characteristics of the Shielded-Coplanar Waveguide by Conformal Mapping Method," Journal of Electro Communication Society, vol. J60-B, No. 8, 1977, pp. 561–566.
T. Sekiguchi et al, "A Multi-chip Packaged GaAs 16×16 Bit Parallel Multiplier," Optoelectronics Laboratories, pp. 1–4.

*Primary Examiner*—Leo P. Picard
*Assistant Examiner*—Cheryl R. Figlin
*Attorney, Agent, or Firm*—Finnegan, Henderson, Farabow, Garrett & Dunner

[57] ABSTRACT

The present integrated circuit package provides both a high density of conductor poles, and reduced crosstalk noise between the conductor poles. The conductor poles are arranged within a selected number of holes in an insulating substrate. Metallized layers for shielding the conductor poles are provided on the walls of the holes in the insulating substrate which receive the conductor poles. In addition, an insulating layer is provided on the inner circumferences of the metallized layers, which insulating layers directly surround the conductor poles to preclude direct contact between the conductor poles and the metallized layers.

16 Claims, 2 Drawing Sheets

INTEGRATED CIRCUIT PACKAGE AND PROCESS FOR PRODUCING SAME

BACKGROUND OF THE INVENTION

1. Field of the Invention

The present invention relates to an integrated circuit package comprising an insulating substrate for receiving a number of conductor poles that pass signals powers, and ground from an integrated circuit mounted on the integrated circuit package.

2. Discussion of the Related Art

Recently, there has been a demand in the field of integrated circuit packaging to reduce the pitch of the conductor poles received in the insulating substrates of integrated circuit packages in order to increase the speed and density, and decrease the size, of the integrated circuits that are mounted on integrated circuit packages.

The art has not been able to overcome two fundamental problems which occur when the pitch of the conductor poles becomes narrow. First, crosstalk noise becomes significantly high between the conductor poles. Accordingly, the art has failed to reach the desired density of the conductor poles and also reduce crosstalk noise. A second problem is that the characteristic impedance of the conductor poles is scatterd which causes a signal reflection noise and deteriorates signal transmission characteristics.

SUMMARY OF THE INVENTION

The present invention has been made in view of the above circumstances and has as an object to provide an integrated circuit package having a high density of conductor poles.

A further object of the present invention is to provide an integrated circuit package having a high density of conductor poles, and reduced crosstalk noise between the conductor poles.

A still further object of the present invention is to provide an integrated circuit package having a high density of conductor poles, which have impedance matching.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects in accordance with the purpose of the invention, as embodied and broadly described herein, the integrated circuit package according to the present invention comprises an insulating substrate having holes which receive conductor poles. Metallized layers constitute a portion of the walls of a selected number of the holes to shield them for the purpose of grounding. In addition, insulating layers for insulating the metallized layers from the conductor poles are formed intermediate to the metallized layers and the conductor poles.

In the integrated circuit package according to the present invention, the conductor poles have coaxial structures in which they are shielded perfectly by the metallized layer, so that crosstalk noise between the conductor poles is greatly reduced in comparison with the prior art integrated circuit packages. Lower crosstalk noise is achieved even when the distance between the conductor poles is largely reduced to increase their density. Further, the present integrated circuit package achieves characteristic impedance matching of the conductor poles, producing reduced signal reflection noise and improved signal transmission characteristics. Still further, the present integrated circuit package provides a shielding effect even when the conductor poles are used for supplying power and not for signal transmission.

BRIEF DESCRIPTION OF THE DRAWINGS

The accompanying drawings, which are incorporated in and constitute a part of the specification, illustrate an embodiment of the invention and, together with the description, serve to explain the objects, advantages, and principles of the invention. In the drawings.

DETAILED DESCRIPTION OF THE PREFERRED EMBODIMENTS

A preferred embodiment of the integrated circuit package according to the present invention will be described with reference to the drawings.

Figure 1:
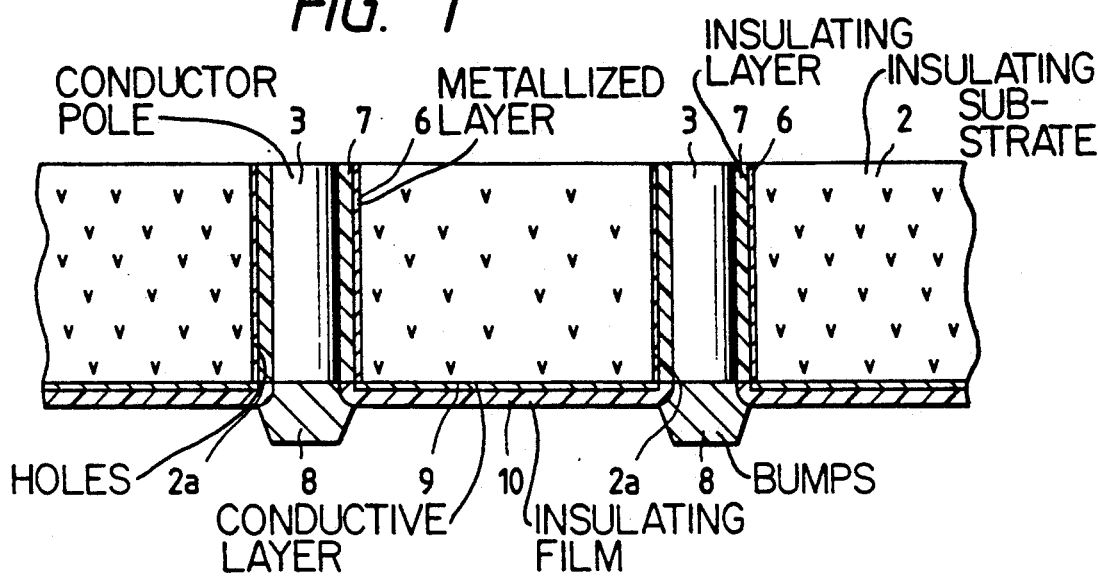
FIG. 1 is a cross-sectional view of a main portion of an embodiment of the integrated circuit package according to the present invention.
Figure 2:
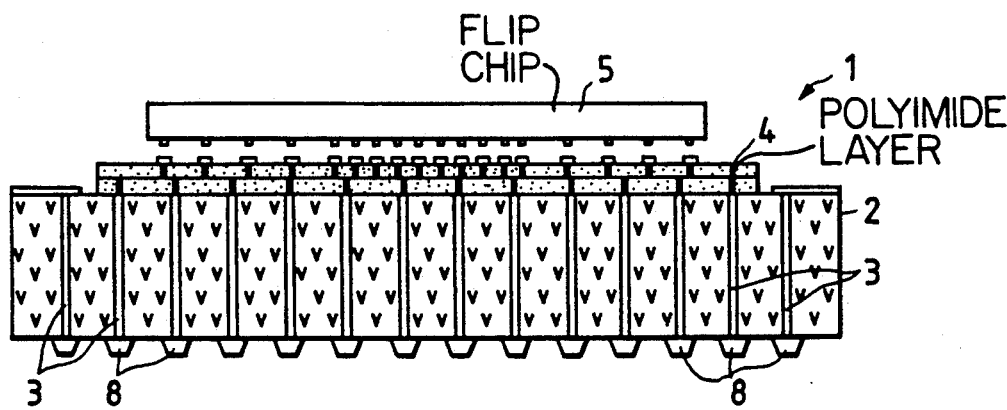
FIG. 2 is a schematic view of an embodiment of the integrated circuit package according to the present invention.

FIG. 1 depicts a cross-sectional view of a main portion of an embodiment of the present integrated circuit package, and FIG. 2 depicts a schematic view of an embodiment of the present integrated circuit package. The integrated circuit package 1 comprises an insulating substrate 2 composed of ceramic, having holes 2a which receive a selected number of conductor poles 3. Two or three layers of wiring (not shown) for leading signals are formed on one side of the integrated circuit package 1 through a polyimide layer 4. A flip chip 5 integrated circuit is mounted on a surface of the polyimide layer 4. After the flip chip 5 has been mounted, a sealing cap (not shown) is secured about the circumference of the insulating substrate 2 to seal the flip chip 5. In a further embodiment of the present invention, the integrated circuit is mounted by TAB or wire bonding.

The insulating substrate 2 is composed of AlN, Al$_2$O$_3$, mullite, glass ceramic, crystallized glass, Si$_3$N$_4$, or like ceramic materials, and it has a thickness of from about 0.5 mm to about 2 mm. Metallized layers 6 for shielding the conductor poles 3 are formed on the walls of a selected number of holes 2a which traverse the insulating substrate 2. In addition, insulating layers 7 for insulating the metallized layers 6 from the conductor poles 3 are formed on the inner surfaces of the metallized layers 6. Thus, the conductor poles 3 do not directly contact the metallized layers 6. The metallized layers 6 are connected electrically to each other through a conductive layer 9. The conductive layer 9 may be formed either on the side of the insulating substrate 2 that is adjacent to bumps 8 formed on an end portion of each conductor pole 3, or inside of the insulating substrate 2 (not shown). The bumps 8 are connected electrically to an electrode on a mother board (not shown). In a further embodiment of the present invention, instead of providing the bumps 8 on an insulating substrate, the present invention may be applied to a PGA package having pins. The conductive layer 9 is connected to a ground (not shown). In addition, an insulating film 10 composed of, e.g., polyimide resin, is formed on a surface of the conductive layer 9. The end portions of the conductor poles 3 are exposed as depicted in FIG. 1.

To produce the insulating substrate 2, first, a thin plate-like green sheet is formed of $Al_2O_3$, AlN, mullite, or a like ceramic material. The sheet is sintered in a furnace to obtain insulating substrate 2, having a thickness of from about 0.5 mm to about 2 mm. Next, a number of through holes 2a having a diameter of from about 0.1 mm to about 0.2 mm, are formed in the insulating substrate 2 by a laser, or like process. In a further embodiment of the present invention, the holes 2a may be formed in the insulating substrate 2 by a drilling or punching process prior to sintering. The pitch of the conductor poles 3 is made very narrow, preferably from about 0.20 mm to about 0.40 mm.

The metallized layers 6 are then formed on the walls of a selected number of holes 2a using a sputtering, plating, evaporating, or like process. The metallized layers 6 are formed of Al, Cu, Ag, or the like, to a thickness of not more than about 10 $\mu$m, more preferably about 5 $\mu$m. Next, the insulating layers 7 are formed on the inner surfaces of the metallized layers 6. The insulating layers 7 are composed of polyimide, glass paste, chemical vapor deposited (CVD) $SiO_2$ film, or the like, and have a thickness of from about 2 $\mu$m to about 20 $\mu$m. The conductor poles 3 are then formed by filling the insulating layers 7 with metals such as Al, Cu, Ag, or the like, by sputtering, plating, or casting techniques. In a further embodiment of the present invention, the conductor poles 3 may be formed as separate pin members, which are coated with an insulating layer, inserted into a selected number of the holes 2a in the insulating substrate 2, and then cured or baked.

Next, the conductive layer 9 and the insulating film 10 are formed on one side of the insulating substrate 2 by conventional techniques, and the bumps 8 are formed on the end portions of the conductor poles 3.

Figure 3:
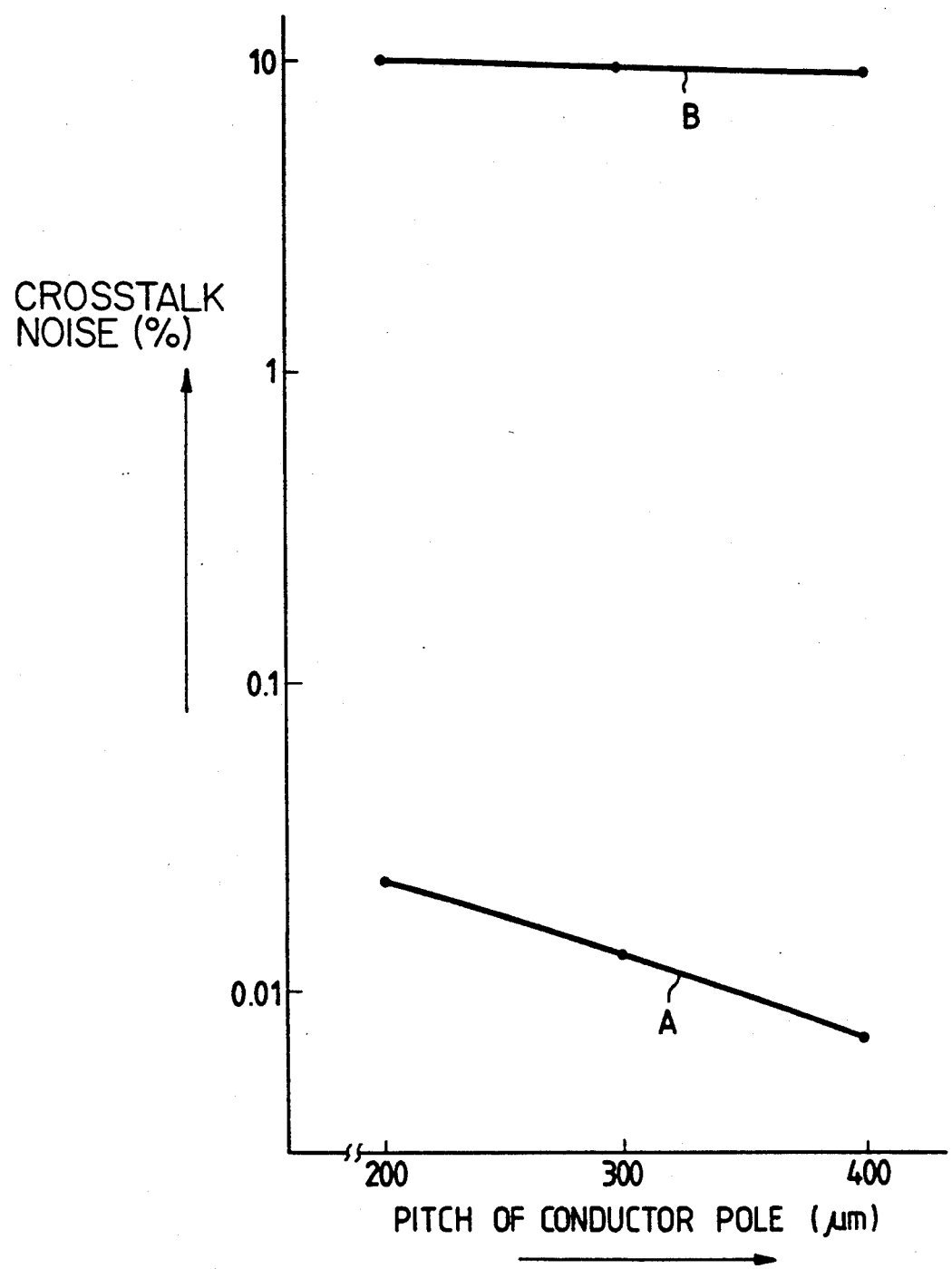
FIG. 3 is a graphical illustration of the relationship between the pitch of the conductor poles and crosstalk noise for a prior art integrated circuit package and the integrated circuit package according to the present invention.

The relationship between the crosstalk noise and the pitch of the conductor poles is graphically illustrated in FIG. 3. The data was measured for integrated circuit packages having an insulating substrate thickness of 1.2 mm. Line A represents the measured data for the present integrated circuit package which incorporates shielding, and line B represents the measured data for a prior art integrated circuit package in which the pitch of the conductor poles in the insulating substrate was made narrow without using shielding. The data was directly measured by a TRD method.

As evident from the two plots in FIG. 3, crosstalk noise is greatly reduced in the integrated circuit package that uses shielding according to the present invention, in comparison to the prior art integrated circuit package which lacks shielding, when the pitch of the conductor poles is made narrow.

The crosstalk noise is greatly reduced in the present integrated circuit package because the holes 2a are coated with metallized layers 6 that are then coated with insulating layers 7 so that each conductor pole 3 has a coaxial structure in which the conductor pole 3 is shielded perfectly. The present invention achieves characteristic impedance matching of the conductor poles 3 which reduces the signal reflection noise to obtain an integrated circuit package 1 having improved signal transmission characteristics.

In addition, because the shielding effect persists when the pitch of the conductor poles is made narrow, the present invention achieves an integrated circuit package having a high density of the conductor poles, that is small and lightweight.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An integrated circuit package comprising:
   an insulating substrate having through holes; conductor poles extending respectively through the substrate holes;
   metallized layers disposed along said substrate holes and disposed about and shielding said conductor poles, said metallized layers being in direct contact with the walls of of said through holes; and
   insulating layers located respectively intermediate said metallized layers and said conductor poles to insulate said metallized layers from said conductor poles.

2. The integrated circuit package of claim 1, wherein said metallized layers are formed by sputtering, plating, or evaporation processes.

3. The integrated circuit package of claim 2, further comprising a conductive layer disposed on said substrate and electrically connecting said metallized layers to each other.

4. The integrated circuit package of claim 3, wherein said metallized layers have a thickness of not more than about 10 $\mu$m.

5. The integrated circuit package of claim 1, wherein said conductor poles are formed by sputtering, plating or casting.

6. The integrated circuit package of claim 1, wherein said insulating layers are disposed along the substrate holes and on the inner peripheries of said metallized layers.

7. The integrated circuit package of claim 1, wherein said conductor poles are pin members which are coated with said insulating layers.

8. The integrated circuit package of claim 5, wherein said conductor poles have a pitch within an approximate range of 0.20 mm to 0.40 mm.

9. The integrated circuit package of claim 7, wherein said conductor poles have a pitch within an approximate range of 0.20 mm to 0.40 mm.

10. The integrated circuit package of claim 6, wherein said insulating layers have a thickness within an approximate range of 2 mm to 20 mm.

11. The integrated circuit package of claim 7, wherein said insulating layers have a thickness of from about 10 $\mu$m to about 20 $\mu$m.

12. A method for forming an integrated circuit package comprising the steps of:
   providing an insulating substrate having through holes, disposing conductor poles to extend through the substrate holes;
   forming metallized layers in direct contact with the walls of the substrate holes to provide a shield about the conductor poles; and
   forming insulating layers intermediate said metallized layers and said conductor poles to insulate said metallized layers from said conductor poles.

13. The method of claim 12, wherein said step of forming said metallized layers comprises sputtering metal on the walls of the selected number of through holes.

14. The method of claim 12, wherein said step of forming said metallized layers comprises plating metal on the walls of the selected number of through holes.

15. The method of claim 12, wherein said step of forming said metallized layers comprises evaporating metal on the walls of the selected number of through holes.

16. The method of claim 12, wherein said step of forming said metallized layers includes the step of electrically connecting said metallized layers to each other through a conductive layer dipped on a side of said substrate from which the holes extend.

* * * * *

UNITED STATES PATENT AND TRADEMARK OFFICE
CERTIFICATE OF CORRECTION

PATENT NO. : 5,286,926
DATED : February 15, 1994
INVENTOR(S) : Yukihiro Kimura et al.

It is certified that error appears in the above-indentified patent and that said Letters Patent is hereby corrected as shown below:

Claim 1, column 4, line 31, delete second occurrence "of".

Claim 10, column 4, line 65, change "2mm to 20mm" to --2ym to 20ym--.

Signed and Sealed this

Fourteenth Day of February, 1995

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,286,926
DATED : February 15, 1994
INVENTOR(S) : Yukihiro Kimura et al.

It is certified that error appears in the above-indentified patent and that said Letters Patent is hereby corrected as shown below:

Claim 1, column 4, line 31, delete second occurrence "of".

Claim 10, column 4, line 65, change "2mm to 20mm" to --$2\mu m$ to $20\mu m$--.

This Certificate Supersedes Certificate of Correction Issued February 14, 1995.

Signed and Sealed this

Third Day of October, 1995

Attest:

BRUCE LEHMAN

*Attesting Officer*  *Commissioner of Patents and Trademarks*